United States Patent [19]
Falcone et al.

[11] Patent Number: 4,948,703
[45] Date of Patent: Aug. 14, 1990

[54] ULTRAVIOLET LIGHT CURABLE COMPOSITION AND USE THEREOF

[75] Inventors: Samuel J. Falcone, San Jose, Calif.; Richard M. Phelan, deceased, late of Tucson, by Lydia C. Phelan, legal representative; David R. Smith, Tucson, both of Ariz.

[73] Assignee: International Business Machines Corporation, Armonk, N.Y.

[21] Appl. No.: 363,756

[22] Filed: Jun. 9, 1989

[51] Int. Cl.$^5$ .............................................. G03C 85/00
[52] U.S. Cl. .................................. 430/281; 430/284; 430/272; 430/280
[58] Field of Search .................. 428/64, 418, 413; 346/135.1; 522/91, 14, 16, 18, 169; 430/281, 284, 272

[56] References Cited
U.S. PATENT DOCUMENTS

| | | | |
|---|---|---|---|
| 4,209,371 | 6/1980 | Lee | 428/418 |
| 4,590,493 | 5/1986 | Inoue et al. | 346/135.1 |
| 4,729,938 | 3/1988 | Tajima et al. | 430/272 |

Primary Examiner—Paul R. Michl
Assistant Examiner—Carmelle Veasley
Attorney, Agent, or Firm—Pollock, Vande Sande & Priddy

[57] ABSTRACT

An ultraviolet light curable composition containing an ethoxylated bisphenol A or bisphenol F diacrylate or dimethacrylate; a polyfunctional acrylate or methacrylate, N-vinyl pyrrolidone, a long chain acrylate or methacrylate, and a photoinitiator, and use thereof.

23 Claims, 2 Drawing Sheets

ULTRAVIOLET LIGHT CURABLE COMPOSITION AND USE THEREOF

DESCRIPTION

Technical Field

The present invention is concerned with ultraviolet light curable compositions and use thereof. In particular, the present invention is concerned with ultraviolet light curable compositions that possess a unique combination of low viscosity and good mechanical properties when cured. The compositions are able to tolerate temperatures up to about 150° C. and are not brittle. The compositions of the present invention are especially useful as the grooving layer for an optical disk.

BACKGROUND ART

Optical discs base plate are widely used for digital audio discs, optical video discs, memory discs and magnetic optical discs. In the fabrication of optical discs it is known to place a liquid photocurable composition referred to as the grooving layer between the glass disk and a grooved pattern, referred to as the stamper. The liquid photocurable composition is then irradiated with ultraviolet light thereby forming a hard film. The stamper is then removed from the cured layer. The cured photocurable layer now has replicated the pattern of the stamper.

The photocurable composition used for the grooving layer should possess a number of important characteristics. For example, the compositions should have relatively low viscosity and yet be capable of rapid cure. The cured layer must have low volatility so that the thin film sputtering chambers that are subsequently used in the processing will not become contaminated. Also, the cured film should be able to tolerate high temperatures of up to 150° C. experienced during subsequent thin film sputtering.

Furthermore, the cured layer must maintain good mechanical properties, glass transition (Tg) and modulus at high temperature. Also, the cured composition must be tough and not too brittle. Moreover, the composition should readily separate from the stamper without causing damage to its edge or produce particles upon separation.

Although certain compositions have been suggested for the grooving or primer layer as exemplified by U.S. Pat. No. 4729938 to Tajima, et al., such compositions have not satisfied all of the above desired properties. For example, achieving low viscosity in conjunction with good mechanical properties over a wide range of temperatures has been elusive. Therefore, the prior art compositions could stand improvement.

SUMMARY OF THE INVENTION

The present invention provides ultraviolet light curable compositions that possess a unique combination of low viscosity and good mechanical properties when cured. The compositions when cured have very high Tg (glass transition temperature) and high modulus over a wide temperature range. In addition, the composition have low viscosity of about 50 to about 150 centipoise at normal room temperatures.

Compositions of the present invention do not cause corrosion or delamination of subsequently applied thin film layers.

In particular, the ultraviolet light curable compositions of the present invention comprise:
A. About 35 to 70% by weight of an ethoxylated bisphenol A or bisphenol F diacrylate or dimethacrylate;
B. A polyfunctional acrylate or methacrylate;
C. N-vinyl pyrrolidone wherein the total of B and C is 25–40% by weight and the ratio of B:A is about 1:2 to 2:1;
D. About 0.1 to about 5% by weight of a long chain acrylate or methacrylate being 10 to 22 carbon atoms; and
E. About 0.1 to about 5% by weight of a photoinitiator.

In addition, the present invention is concerned with an optical disc base plate that employs the above composition as the grooving layer. In particular, the present invention is concerned with an optical disc base plate that comprises a transparent substrate, a grooving layer formed on the substrate and having depressions and protuberances for carrying information signals, and a recording film formed on the primer layer, said grooving layer being obtained by curing with ultraviolet light irradiation an ultraviolet-curable resin composition comprising:
A. About 35 to about 70% by weight of an ethoxylated bisphenol A or bisphenol F diacrylate or dimethacrylate;
B. A polyfunctional acrylate or methacrylate,
C. N-vinyl pyrrolidone wherein the total of B and C is 25–40% by weight and the ratio of B:A is about 1:2 to 2:1;
D. About 0.1 to about 5% by weight of a long chain acrylate or methacrylate being 10 to 22 carbon atoms; and
E. About 0.1 to about 5% by weight of a photoinitiator.

BEST AND VARIOUS MODES FOR CARRYING OUT INVENTION

Figure 1:
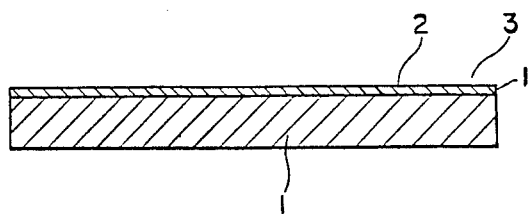
FIGS. 1 to 6 are cross-sectional views of parts of an optical disc for illustrating a production process of an optical disc.

The ultraviolet light compositions of the present invention contain at least one of an ethoxylated bisphenol A diacrylate, and ethoxylated bisphenol A dimethacrylate, an ethoxylated bisphenol F diacrylate, or ethoxylated bisphenol F dimethacrylate. Mixtures of these materials can be employed if desired.

Such materials are commercially available including Sartomer 349 which is ethoxylated bisphenol A diacrylate from Arco Chemical Company.

The above compounds are employed in the compositions in amounts of about 35 to about 70% by weight and preferably about 45% to about 60% by weight The compositions of the present invention must also include N-vinyl pyrrolidone and a polyfunctional acrylate and/or polyfunctional methacrylate as reactive diluents. The total amount of the N-vinyl pyrrolidone and polyfunctional acrylate or methacrylate in the composition is about 25 to about 40% by weight and preferably about 30% to about 36% by weight with the ratio of the N-vinyl pyrrolidone to polyfunctional acrylate or methacrylate being about 1:2 to about 2:1 and preferably about 1:1.

The polyfunctional acrylates and methacrylates contain at least 3 acrylate and/or methacrylate groups and usually not more than 4 such groups. Examples of such materials are trimethylolpropane triacrylate, trimethylolpropane trimethacrylate, 1,2,4-butane triol trimethacrylate, pentaerythritol tetramethacrylate; pentaerythritol triacrylate; glycerol triacrylate, glycerol trimethacrylate, trimethylolethane trimethacrylate; and trimethylolethane triacrylate.

The preferred polyfunctional acrylate or methacrylate being trimethylolpropane triacrylate.

In addition, the compositions of the present invention must include a long chain monoacrylate and/or long chain monomethacrylate. Usually the acrylate and/or methacrylate contains 10 to 22 carbon atoms and preferably 12 to 18 carbon atoms. Suitable examples are isodecyl acrylate and stearyl methacrylate. The long chain acrylate and/or methacrylate improves the edge condition of the composition after removal of the stamper. Such also results in reduced contamination from the stamping process and improvement in the actual release of the stamper from the cured composition. The long chain acrylate and/or methacrylate is usually present in the composition in amounts of about 0.1–5% by weight and preferably about 1 to about 3% by weight.

The compositions of the present invention also contain about 0.1 to about 5% by weight and preferably about 2 to about 4% by weight of a photoinitiator. Examples of photoinitiators are as follows:

Benzils such as benzil,

Benzoins such as benzoin, benzoin methyl ether, benzoin ethyl ether, benzoin isopropyl ether, benzoin isobutyl ether, and a-methylbenzoin.

Benzophenones such as 1-hydroxycyclohexyl benzophenone,

Acetophenones such as acetophenone, 2,2,2-tribromoacetophenone, and dimethoxyphenyl acetophenone, Thioxanthones such as 2-chlorothioxanthone, 2-methylthioxanthone, Anthraquinones such as 2-ethylanthraquinone, 2-methylanthraquinone, Benzylketals such as benzyl dimethyl ketal, These photopolymerization initiators can be used alone or as a mixture thereof.

The preferred photoinitiator is dimethoxyphenyl acetophenone.

The ultraviolet-curable resin composition is, for example, poured into a space formed by two glass plates and pressed at a pressure of 2 to 20 g/cm$^2$, preferably 5 to 15 g/cm$^2$ and exposed to ultraviolet irradiation at 50 to 400 mW/cm$^2$, preferably 100 to 250 mW/cm$^2$, using a high-pressure mercury lamp, xenon lamp, or the like (e.g.—any lamp with considerable output at 365 nanometers) to cure the resin composition.

Using the ultraviolet-curable resin composition, plastic information-recording media such as optical discs can be produced according to conventional processes as shown in FIGS. 1 to 5.

For example, as shown in FIG. 1, a photo resist film (2) with a uniform thickness is formed on a surface of a substrate (1) such as a smooth glass plate to give a disc base plate (3).

Figure 2:
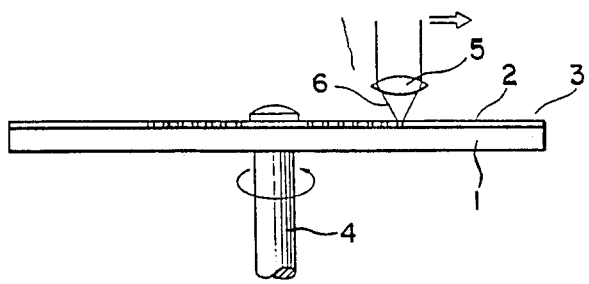

Then, as shown in FIG. 2, the disc base plate (3) is mounted on a spindle (4), rotated and irradiated with a laser light (6) for cutting modulated by predetermined tracking signals on the photo resist film (2) while moving a laser head (5) from an inner side to an outer side of the disc plate (3).

Subsequently, the photo resist film (2) is subjected to a developing treatment to remove the portions exposed to the laser light (6) for cutting and to produce a recorded base plate wherein grooves for carrying information are formed.

Figure 3:
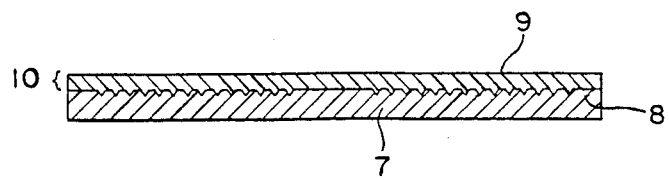

An electroconductive film (8) is formed on the photo resist film (2) of the recorded base plate by vapor deposition of Ni or the like, followed by the formation of an electroformed film (9) using a metallic material such as Ni, or the like on the electroconductive film (8), as shown in FIG. 3. Then, a laminated body of the electroconductive film (8) and the electroformed film (9) is removed from the interface of the electroconductive film (8) and the photo resist film (2) to give a stamper (10).

Figure 4:
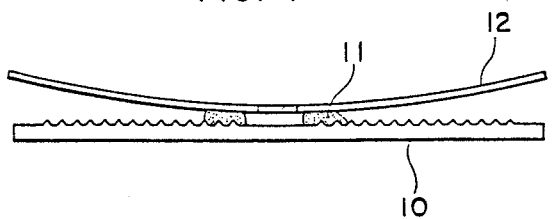

On the transcription side of the grooves of stamper (10), an ultraviolet-curable resin composition (11) for a grooving layer is coated as shown in FIG. 4 and the resin composition (11) is stretched uniformly by using a transparent substrate (12) made from glass, plastic or the like.

Figure 5:
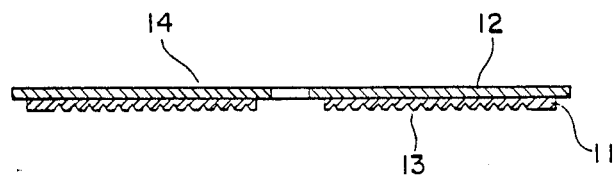

After curing the resin composition (11) for the grooving layer, an integrated body of the grooving layer and the substrate is removed from the interface of the stamper (10) and the grooving layer resin (11). Then, a recording film (13) made of a metallic material such as Bi, In, Te, As, Pb, Sn, or the like with almost uniform thickness is formed on the surface of the grooving layer resin (11) to give an optical disk base plate (14) integrally formed of the recording film (13), the grooving layer resin (11) and the transparent substrate (12) as shown in FIG. 5.

Among the materials for forming the recording film, there can preferably be used Te series materials such as Te compounds containing Pb, e.g., Te-Se-Pb crystalline chalcogenide (e.g., $Te_{80}Se_{10}Pb_{10}$), Te-C obtained by plasma codepositing $CH_4$, etc., on Te, Te-CS obtained by plasma codepositing $CS_2$ on Te, $TeO_x$ obtained by plasma codepositing $TeO_2$ and Te, and the like.

Figure 6:
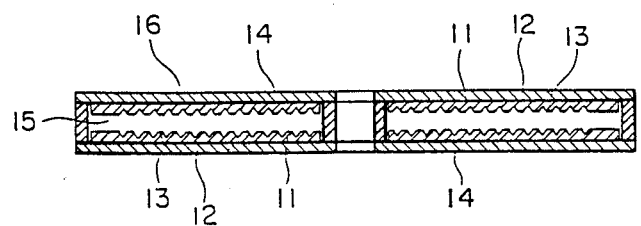

Finally, two optical disc base plates (14,14) are placed in parallel so as to face the grooving layer resin sides towards each other and bonded via spacers with a predetermined space (15) between the opposite recording films (13,13), (or via a layer made from a substance having very little thermal conductivity to give a desired optical disc (16) for recording information as shown in FIG. 6.

The following non-limiting examples are presented to further illustrate the present invention.

EXAMPLE 1

A composition containing about 60% by weight of Sartomer 348, about 18% by weight of trimethylolpropane triacrylate, about 18% by weight of N-vinyl pyrrolidone, about 2% by weight of isodecyl acrylate and about 2% by weight of dimethoxy-2-phenyl acetophenone is prepared. The composition has a viscosity of about 100 centipoise at 25° C. The composition is cured by exposure to ultraviolet light having a wavelength of about 365 nanometers at 40 milliwatts/cm$^2$ for 75 seconds. The cured composition has a Tg of 195° C., a modulus of 102,000 psi at 25° C. and 17,000 psi at 200° C.

What is claimed is:

1. An ultraviolet light curable composition comprising:

A. About 35 to about 70% by weight of an ethoxylated bisphenol A or bisphenol F diacrylate or dimethacrylate;
B. A polyfunctional acrylate or methacrylate;
C. N-vinyl pyrrolidone wherein the total of B and C is 25–40% by weight and the ratio of B:A is about 1:2 to 2:1;
D. About 0.1 to about 5% by weight of a long chain acrylate or methacrylate being 10 to 22 carbon atoms; and
E. About 0.1 to about 5% by weight of a photoinitiator.

2. The composition of claim 1 wherein A is ethoxylated bisphenol A dimethacrylate.

3. The composition of claim 1 wherein said polyfunctional acrylate or methacrylate is trimethylolpropane triacrylate.

4. The composition of claim 1 wherein said long chain acrylate or methacrylate is isodecyl acrylate or stearyl methacrylate or mixtures thereof.

5. The composition of claim 1 wherein said long chain acrylate or methacrylate includes isodecyl acrylate.

6. The composition of claim 1 wherein said photoinitiator includes dimethoxy-2-phenyl acetophenone.

7. The composition of claim 1 wherein said photoinitiator is present in amounts of about 2 to about 4% by weight.

8. The composition of claim 1 wherein the long chain acrylate or methacrylate is present in amounts of about 1 to about 3% by weight.

9. The composition of claim 1 wherein the ratio of N-vinyl pyrrolidone to polyfunctional acrylate or methacrylate is about 1:1.

10. The composition of claim 1 wherein contains about 60% by weight of ethoxylated bisphenol A dimethacrylate or ethoxylated bisphenol A diacrylate or mixtures thereof; About 18% by weight of N-vinyl pyrrolidone; about 18% by weight of trimethylol propane triacrylate; about 2% by weight of isodecyl acrylate or stearyl methacrylate or mixtures thereof; and about 2% by weight of dimethoxy-2-phenyl acetophenone.

11. An optical disc base plate comprising a transparent substrate, a grooving layer formed on the substrate and having depressions and protuberances for carrying information signals, and a recording film formed on the grooving layer, said grooving layer being obtained by curing with ultraviolet light irradiation an ultraviolet-curable resin composition comprising:

A. About 35 to about 70% by weight of an ethoxylated bisphenol A or bisphenol F diacrylate or dimethacrylate;
B. A polyfunctional acrylate or methacrylate;
C. N-vinyl pyrrolidone wherein the total of B and C is 25–40% by weight and the ratio of B:A is about 1:2 to 2:1;
D. About 0.1 to about 5% by weight of a long chain acrylate or methacrylate being 10 to 22 carbon atoms; and
E. About 0.1 to about 5% by weight of a photoinitiator.

12. The optical disc base plate of claim 11 wherein A is ethoxylated bisphenol A dimethacrylate.

13. The optical disc base plate of claim 11 wherein said polyfunctional acrylate or methacrylate is trimethylolpropane triacrylate.

14. The optical disc base plate of claim 11 wherein said long chain acrylate or methacrylate is isodecyl acrylate or stearyl methacrylate or mixtures thereof.

15. The optical disc base plate of claim 11 wherein said long chain acrylate a methacrylate includes isodecyl acrylate.

16. The optical disc base plate of claim 11 wherein said photoinitiator includes dimethoxy-2-phenyl acetophenone.

17. The optical disc base plate of claim 11 wherein said photoinitiator is present in amounts of about 2 to about 4% by weight.

18. The optical disc base plate of claim 11 wherein the long chain acrylate or methacrylate is present in amounts of about 1 to about 3% by weight.

19. The optical disc base plate of claim 11 wherein the ratio of N-vinyl pyrrolidone to polyfunctional acrylate or methacrylate is about 1:1.

20. The optical disc base plate of claim 11 wherein said composition contains about 60% by weight of ethoxylated bisphenol A dimethacrylate or ethoxylated bisphenol A diacrylate or mixtures thereof;
About 18% by weight of N-vinyl pyrrolidone; about 18% by weight of trimethylol propane triacrylate; about 2% by weight of isodecyl acrylate or stearyl methacrylate or mixtures thereof; and about 2% by weight of dimethoxy-2-phenyl acetophenone.

21. The composition of claim 1 wherein the viscosity at normal room temperatures is about 50 to about 150 centipoise.

22. The optical disc base plate of claim 11 wherein the grooving layer is able to tolerate temperatures of up to about 150° C.

23. The optical disc base plate of claim 22 wherein said composition has a viscosity at normal room temperatures of about 50 to about 150 centipoise.

* * * * *